United States Patent [19]
Darrel

[11] 4,095,173
[45] June 13, 1978

[54] METHOD AND SYSTEM FOR CORONA SOURCE LOCATION BY ACOUSTIC SIGNAL DETECTION

[75] Inventor: Bernard Darrel, Schenectady, N.Y.

[73] Assignee: General Electric Company, Schenectady, N.Y.

[21] Appl. No.: 754,910

[22] Filed: Dec. 27, 1976

[51] Int. Cl.² .................. G01R 31/08; G01R 31/06
[52] U.S. Cl. ........................................... 324/52
[58] Field of Search .................. 324/52, 54, 72, 55

[56] References Cited
U.S. PATENT DOCUMENTS

| | | | |
|---|---|---|---|
| 3,430,136 | 2/1969 | Brustle et al. | 324/52 |
| 3,707,673 | 12/1972 | Carter | 324/52 |
| 3,801,899 | 4/1974 | Liao | 324/52 |
| 3,991,364 | 11/1976 | Wiznerowicz | 324/52 |

Primary Examiner—Gerard R. Strecker
Attorney, Agent, or Firm—Donald R. Campbell; Joseph T. Cohen; Marvin Snyder

[57] ABSTRACT

To locate a corona fault in a transformer or other encased electrical apparatus by determining the propagation time for acoustic noise generated by a corona discharge, the electrical corona signal is gated and level-detected during an interval which is adjustable as to delay and length to thereby generate a timing reference to initiate acoustic signal averaging. The corona pulse can be found that results in an optimum signal-to-noise ratio in the acoustic signal being averaged, as is needed with limited test data in a noisy or reverberant acoustic environment. Also, multiple corona sources can be located.

12 Claims, 12 Drawing Figures

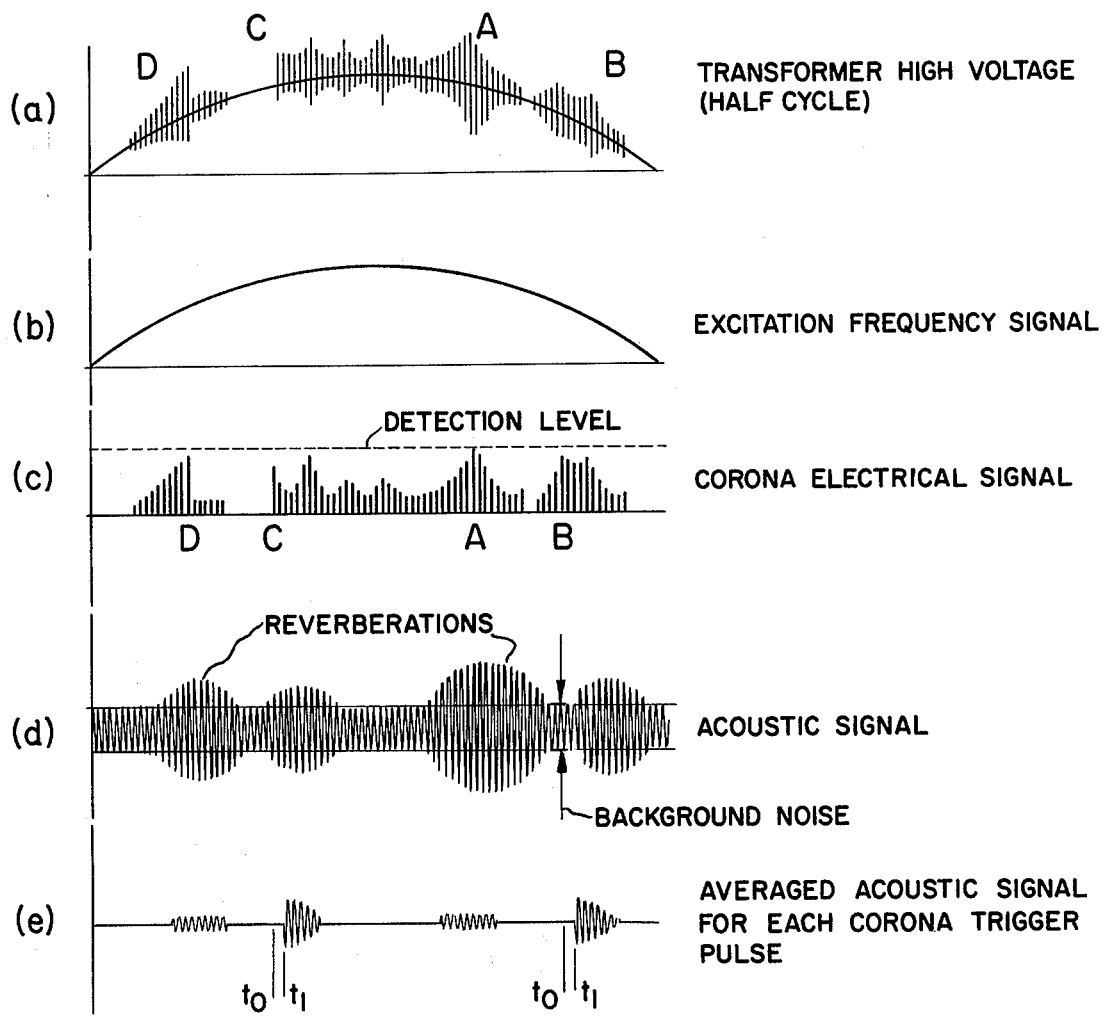
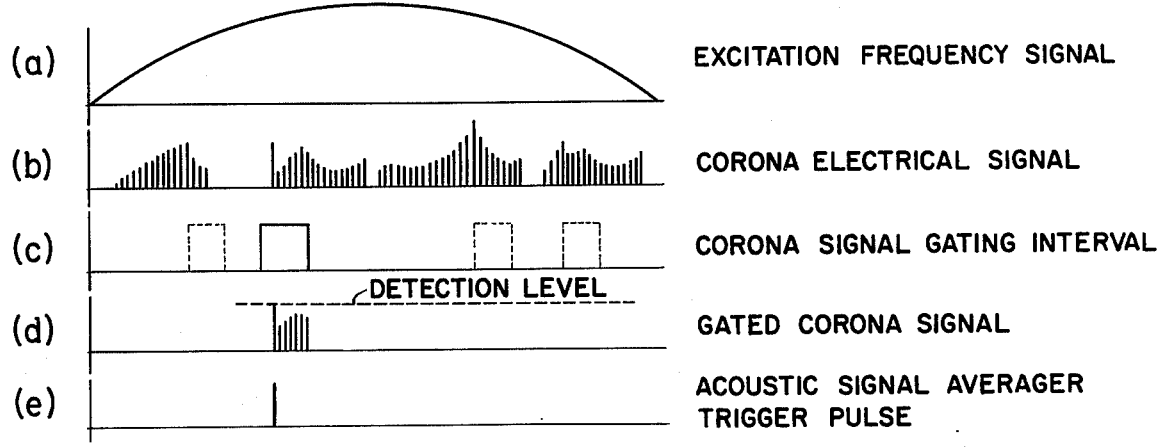

4,095,173

METHOD AND SYSTEM FOR CORONA SOURCE LOCATION BY ACOUSTIC SIGNAL DETECTION

BACKGROUND OF THE INVENTION

This invention relates to the testing of electrical apparatus for corona faults, and more particularly to an improved method and system for locating corona sources in transformers and other electrical apparatus by sensing and averaging the acoustic noise generated by a corona discharge.

The site of incipient corona faults in encased electrical apparatus such as large transformers can be located by determining the time for sound waves produced by a corona discharge to propagate to an acoustic sensor at a known position. As a timing reference to indicate initiation of the corona discharge, the high frequency corona electrical signal superimposed on the power frequency output voltage is detected. By measuring the acoustic propagation time from a corona source to several sensor positions, and with knowledge of the acoustic velocity in the liquid or gas filling the transformer housing, the distances to the corona source can be calculated and the location determined by triangulation. Repair efforts to replace or repair the faulty section may then proceed more efficiently because of the reduced amount of disassembly that is needed.

The accurate detection of an acoustic signal representing the received sound waves is made difficult because of the noisy acoustic environment within the transformer housing. Often there are several corona discharges from the same source within a half cycle of the excitation frequency, and the acoustic noise from each discharge reverberates within the housing for a significant amount of time. There is also background noise, and other noise sources in the transformer which resonate at the frequency of the discharge noise are excited and contribute to the noise. For this reason, averaging or integrating the acoustic signal over a large number of cycles has been employed to improve the signal-to-noise ratio, and is further described for instance in U.S. Pat. No. 3,430,136 to H. F. Brustle et al. In this patent, a large corona electrical pulse is used as a timing reference to start the signal averaging in each half cycle, reasoning that a large corona pulse should produce a large acoustic signal resulting in a good signal-to-noise ratio. This is true many times, but when the large corona pulse is preceded by other pulses of almost the same energy the resultant reverberations produce a poor signal-to-noise ratio. Since the test time is limited, signal averaging over the available number of half cycles will not sufficiently enhance the signal-to-noise ratio to allow the operator to locate the fault.

Other prior art approaches, not necessarily relying on acoustic signal averaging, initiate acoustic signal testing at only the peaks of the transformer output voltage, or during a predetermined fixed portion (or fixed window) of the transformer output voltage half cycle. All of these schemes have their merits, but none is successful in locating corona faults when the corona discharges are so close together that large reverberations swamp the acoustic signal. Normally, this occurs to a moderate extent in all cases where corona exists. Furthermore, multiple corona sources confused the operator.

SUMMARY OF THE INVENTION

In a method for locating corona faults in encased electrical apparatus such as power transformers in which the electrical corona signal is detected to derive a timing reference to initiate acoustic signal averaging, a greater degree of success and improved accuracy is achieved by the ability to search for the electrical corona pulse that results in averaging an acoustic signal with an optimum or acceptable signal-to-noise ratio. In a reverberant and noisy acoustic environment, for example, an electrical corona pulse not immediately preceded by one of similar size results in the best signal-to-noise ratio since this allows reverberations to decay and reduces background noise. Moreover, multiple corona sources can be identified and located.

In practicing the method, the voltage at the high potential conductor is filtered to derive an excitation frequency component signal and a radio frequency component corona signal. The corona signal is cyclically gated and level detected during a preselected gating interval which is adjustable as to delay relative to the zero crossing or other reference on the excitation frequency signal. The length of the gating interval, or width of the movable window, is adjustable as well as the corona signal amplitude at which the timing reference is generated to initiate acoustic signal averaging. The acoustic electrical signal generated by an acoustic transducer at a known position and representing acoustic vibrations within the apparatus housing is now repeatedly averaged over a preset period to produce an averaged acoustic signal. Upon display, the averaged acoustic signal provides an indication of the distance from the known acoustic transducer position to the corona source.

The corona fault location system includes adjustable corona signal gating means which, in the exemplary embodiment, is comprised by a zero crossing detector for the excitation frequency signal, a timing pulse generator such as a monostable multivibrator with provision for operator controlled independent adjustment of both the delay and width of the timing pulse, and an analog switch actuated by the timing pulse to gate the corona signal to an operator controlled adjustable level detector. Other components of the system are evident from the foregoing discussion.

BRIEF DESCRIPTION OF THE DRAWINGS

FIGS. 2a–2e are waveform diagrams and signal representations at several points in the corona fault location system to explain the deficiencies of the prior art technique of selecting the largest corona pulse as the signal averager timing reference;

FIGS. 3a–3e are a series of waveform diagrams and representations applicable to operation of the system in FIG. 1.

DESCRIPTION OF THE PREFERRED EMBODIMENT

Figure 1:
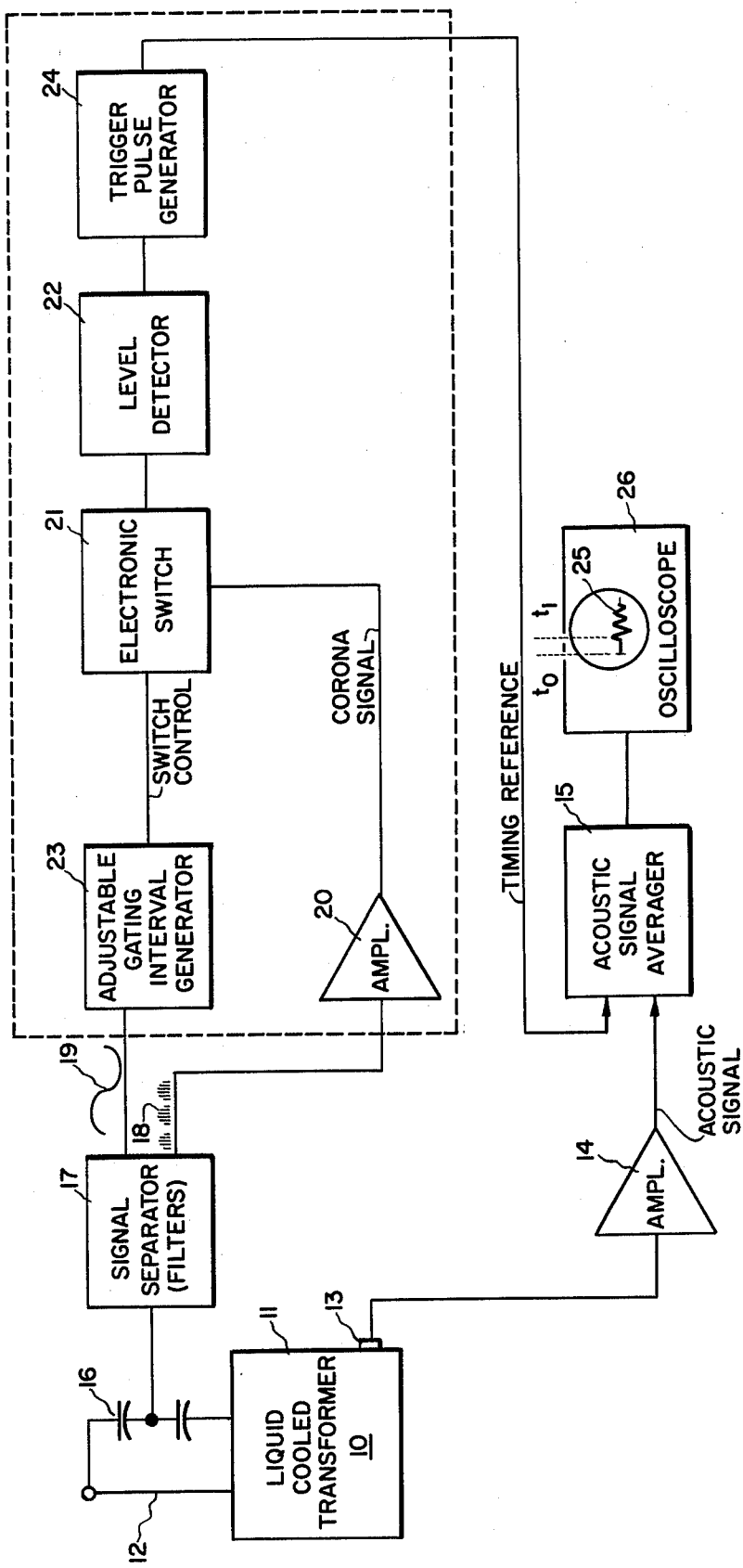
FIG. 1 is a block diagram of the corona fault location system with an adjustable corona signal gating interval for selecting the corona pulse to be level-detected and serve as a timing reference to trigger the acoustic signal averager.

The corona fault location system in FIG. 1 is explained with regard to the testing of an encased, liquid-cooled power transformer 10 and locating one or more corona sources within transformer housing 11. Although not here illustrated, the transformer housing contains magnetically coupled low voltage and high voltage windings wound on a magnetic core and immersed in insulating oil, and has an externally accessible high potential conductor 12. The method and system for corona fault location are featured by the improved selection of an electrical corona pulse as a timing reference to initiate acoustic signal-averaging. The technique is particularly successful in deriving an averaged acoustic signal in a noisy or reverberant acoustic environment from a limited amount of test data in view of the destructive nature of high voltage testing and the relatively short available test time. When an electrical corona pulse with the best available or acceptable signal-to-noise ratio is selected, signal-averaging is successful to generate an acoustic signal delayed in time from the timing reference by an amount proportional to the distance between the corona source and an acoustic sensor in a known location. Additionally, multiple corona sources can be identified and located. The system will be described briefly first to facilitate an understanding of the electrical and acoustic waveforms in FIGS. 2 and 3.

In FIG. 1, corona faults occurring within transformer housing 11 generate ultrasonic frequency acoustic noise which radiates outward in all directions and is sensed by an acoustic transducer 13 such as an accelerometer or hydrophone mounted on the exterior of housing 11 or immersed in the insulating oil within the housing. The acoustic electrical signal, in addition to the noise generated by a corona discharge, represents the summation of all acoustic vibrations within the transformer housing including general background noise, reverberations, and other noise sources with a similar mechanical resonance frequency that are excited. The acoustic electrical signal is fed to an amplifier 14 and then is supplied to one input of an acoustic signal averager 15 which functions to time-average the acoustic signal over a relatively short preset period upon being cyclically triggered by a timing reference trigger pulse. Signal averager or integrator 15 can be a commercially available piece of equipment.

Corona discharges also produce very high frequency electrical disturbances that are superimposed on the excitation or fundamental frequency high voltage wave. To separate the radio frequency corona-produced component from the excitation frequency component, a low voltage capacitance tap 16 comprising a capacitance voltage divider is connected between high potential conductor 12 and ground, with the low voltage at the junction of the series capacitors being fed to a signal separator 17. Signal separator 17 includes high pass and low pass filters for respectively deriving the radio frequency corona signal 18 and the excitation frequency signal 19. Corona electrical signal 18 is fed to an amplifier 20 and hence to an electronic switch 21. The segment of the corona signal gated by the electronic switch to a level detector 22 is selected by an adjustable gating interval generator 23 which enables the electronic switch. Excitation frequency signal 19 is fed to gating interval generator 23, which functions to produce a timing pulse with an adjustable delay, or adjustable delay and width, with respect to the zero crossing or another reference on the excitation frequency signal. The interval or movable time window during which the corona signal is gated and level-detected is adjustable and can be initiated at any selected phase angle of the excitation frequency. Upon detecting a predetermined adjustable corona signal amplitude, trigger pulse generator 24 is actuated and transmits the timing reference trigger pulse to initiate operation of the signal averager 15.

Because of the capability of adjustably gating and level-detecting the corona signal during a preselected gating interval, any or all corona electrical pulses can be used as a timing reference to initiate acoustic signal averaging. As will be further explained, this is not necessarily the largest electrical corona pulse or a corona pulse occurring at the peak of the excitation frequency or at some other fixed position within the excitation frequency cycle. Accordingly, the timing reference can be selected which results in the best available or acceptable signal-to-noise ratio in the segment of the acoustic signal being repeatedly time-averaged, using the limited number of samples available during relatively short test periods. Signal-averaging enhances the desired acoustic signal component representing noise generated by the corona discharge, while tending to average out the other randomly occurring acoustic vibrations that are sensed. Each averaged acoustic signal 25 is displayed to the operator using an oscilloscope 26 or other display device. The time delay between reference time $t_o$ and the initial excursion of averaged acoustic signal 25 at $t_1$ is proportional to the distance between the corona source and the known position of acoustic transducer 13. Several such distances can be determined by multiple acoustic transducers at different positions taking data simultaneously, or by moving the single transducer to several positions and taking data serially from which distances the location of the corona source can be calculated by triangulation.

The normal relationships between the transformer high voltage and excitation frequency voltage component, the corona electrical signal, and the acoustic noise within the transformer housing are shown in FIGS. 2a–2d with respect to the prior art technique of detecting the largest electrical corona pulse for use as a timing reference for signal-averaging. The transformer voltage at high potential conductor 12 (FIG. 2a) is comprised of a 60 Hz or other power frequency fundamental component on which is superimposed the radio frequency component corona signal resulting from electrical disturbances accompanying corona discharge. Four electrical corona pulse A–D are illustrated, and all are assumed to be caused by electrical discharges at the same corona source and emit an acoustic signal and thus could under the proper circumstances be used as a timing reference for acoustic signal-averaging. FIGS. 2b and 2c show the separated excitation frequency signal and corona electrical signal, the latter being rectified and represented by a series of straight lines with different amplitudes. Referring to FIG. 2d, within the transformer housing there is an underdamped acoustic environment. Each corona pulse can produce an acoustic signal, but each acoustic signal is generally smaller than the background noise particularly when many corona pulses close together produce reverberations. During reverberations the reflected acoustic waves can reinforce one another, and the acoustic energy produced by any single corona pulse is insignificant compared to the total reverberant energy. Furthermore, the reverberant period is relatively long and may be as much as twenty percent of the excitation frequency half-cycle. Since averaging improves the signal-to-noise ratio in proportion to the square root of a number of samples, sufficient enhancement cannot be achieved with a limited amount of test data.

In FIG. 2c, the detection level is set to detect the corona pulse A, which is by far the largest corona and according to the prior art would normally be used as the timing reference because it is easily detected by level. However, it occurs during the reverberant period and the signal-to-noise ratio of the acoustic signal being averaged is relatively high. As is shown in FIG. 2e, the random acoustic signal components due to reverberations, background noise, and other noise sources that may be excited, tend to cancel one another when a small number of samples are averaged; although the desired acoustic signal representing sensed corona discharge noise could be extracted if there were a much larger number of samples. Corona pulses B and C are better timing reference choices but cannot be detected by level sensing along. Corona C cannot be detected because of corona D, and corona B cannot be detected because of corona A. In FIG. 2e, corona pulses B and C, if detected as timing references, would permit extraction of an averaged acoustic signal; whereas corona pulse D is preceded by corona of similar amplitude and has a high signal-to-noise ratio such that an averaged acoustic signal is not extracted. It is evident from these examples that the best signal-to-noise ratio in the acoustic signal being time-averaged is achieved by selecting a corona pulse that is not immediately preceded by one of similar size. This allows the reverberations to decay, reducing the background noises. Therefore, an adjustable gating interval or time window with an adjustable delay from the zero crossing or other reference on the excitation frequency signal is used as previously explained to select any corona pulse for a timing reference. The corona signal amplitude detection level is also adjustable, and it is advantageous to adjust the length of the gating interval or width of the time window. This allows the operator access to every single corona pulse for use as a reference for time-averaging and therefore allows him to search for the best signal-to-noise ratio or an acceptable signal-to-noise ratio. A fixed time window as in the prior art is ineffective, since the first large corona through the window makes all subsequent pulses inaccessible.

FIG. 3a–3e relate to operation of the corona fault location system in FIG. 1 and to the present method for locating corona faults with a movable time window for gating and level-detecting the corona electrical signal. FIGS. 3a and 3b depict the excitation frequency signal and corona electrical signal, as before. In FIG. 3c, the movable time window or adjustable gating interval for the corona signal is illustrated in full lines for the selection of corona pulse C for the acoustic signal averaging timing reference, and alternate positions in dashed lines for the selection of other corona pulses. For the full line time window, FIG. 3d shows the gated corona signal and the detection level at which a trigger pulse (FIG. 3e) for the acoustic signal averager is generated. Similarly, other corona pulses can be isolated and level-detected at an adjustable signal amplitude level to generate other timing reference trigger pulses.

Figure 4:
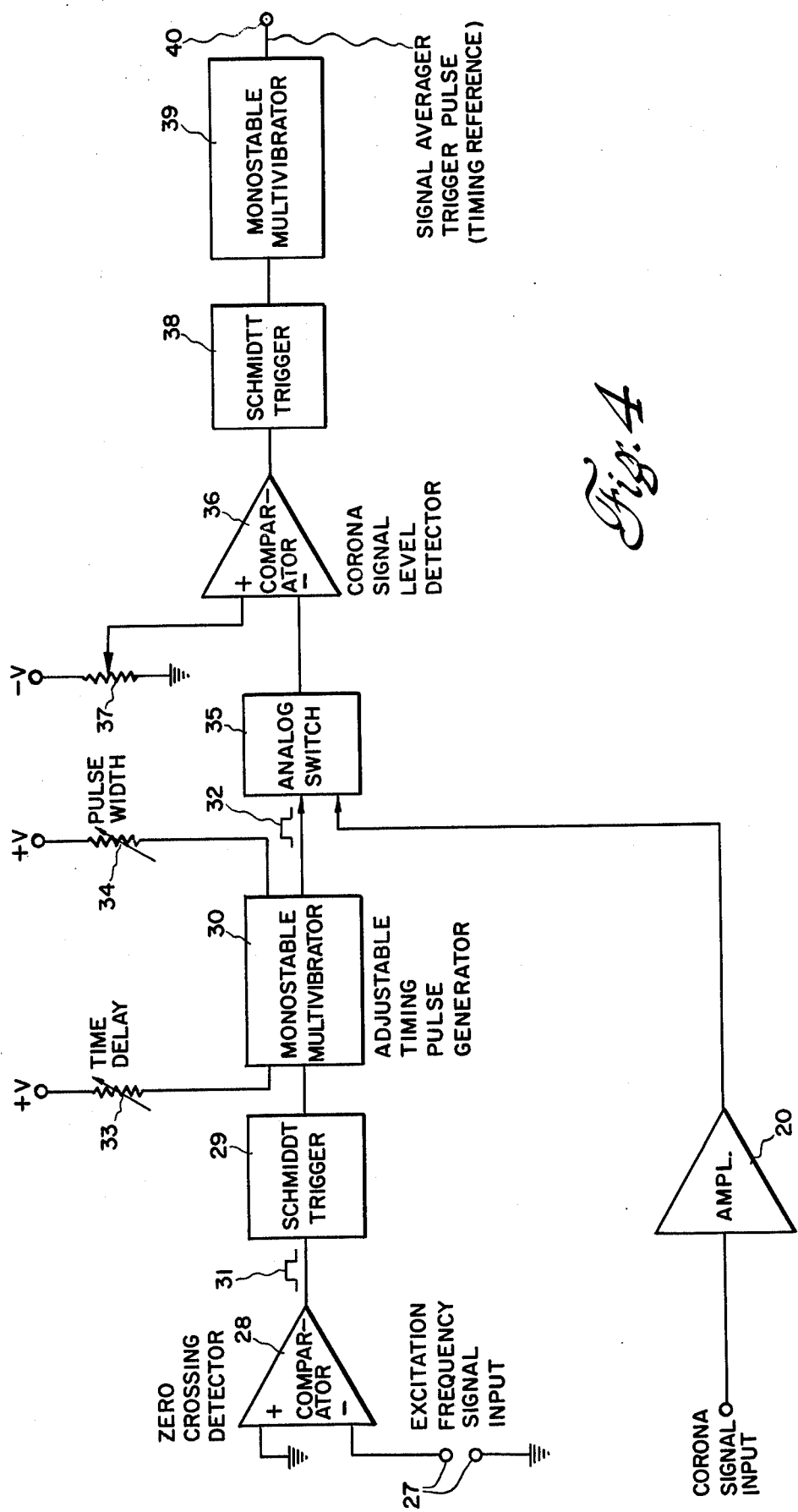
FIG. 4 is a more detailed block diagram of one embodiment of the portion of the system within the dashed rectangle in FIG. 1.

An exemplary embodiment of the portion of the corona fault location system in dashed lines in FIG. 1 is given in simplified block diagram form in FIG. 4. Excitation frequency signal 19 is applied to input terminals 27 of the adjustable gating interval generator, which is comprised by a comparator 28 functioning as zero crossing detector, a Schmidtt trigger 29, and a monostable multivibrator 30 or an equivalent digital interval generator, functioning as an adjustable timing pulse generator. Input terminals 27 are coupled to an inverting input of comparator 28 while the noninverting input is referenced to ground, so that the approximately square wave comparator output 31 changes level upon passing through zero in the negative to positive direction and again changes level upon passing through zero in the positive to negative direction. Schmidtt trigger 29 functions as a pulse shaper to ensure a rapid transition of the leading edge of the comparator output. This starts a time delay produced by dual retriggerable monostable multivibrator 30, and at the end of the variable delay a timing pulse 32 with a predetermined width is generated. The time delay from the zero crossing of the transformer excitation signal to generation of the timing pulse is adjusted by an operator controlled variable resistor 33, and the pulse width is independently adjustable by another operator controlled variable resistor 34.

Timing pulse 32 enables an analog switch 35 and gates a variable segment of the amplified corona electrical signal 18 as determined by the width of the timing pulse. The gated ac corona signal at the output of analog switch 35 is applied to the inverting input of another comparator 36 used as an adjustable level detector. The negative reference voltage at the noninverting input is adjustable by means of an operator-controlled potentiometer 37, such that the comparator output changes level whenever the corona signal amplitude exceeds a predetermined adjustable value as set by the potentiometer. The leading edge of the comparator output pulse is shaped by a Schmidtt trigger 38, and a retriggerable monostable multivibrator 39 increases the width of the output pulse to be compatible with the trigger circuit of acoustic signal averager 15. The signal averager timing reference or trigger pulse at output terminal 40 is generated cyclically during each negative half-cycle of the excitation frequency signal. This is not essential, however, as the foregoing circuitry can be arranged to generate timing pulses during the positive half-cycle or during both half-cycles of the excitation frequency.

In the exemplary embodiment being described, acoustic transducer 13 is an accelerometer having a peak response in the range of about 30–35 kHz. Background noise in this frequency range is particularly troublesome and needs to be averaged out. Signal averager 15 is, for example, the Digital Signal Analyzer, Model NS-575A, manufactured by Northern Scientific, Inc., Middleton, Wisconsin, a division of Tracor, Inc. In using this equipment, a fast sampling rate is selected. Frequently, the acoustic and electrical signals fed to signal averager 15 are recorded and played over repeatedly. For further information on this feature, the reader is referred to previously mentioned U.S. Pat. No. 3,430,136 to Brustle et al, the disclosure of which is incorporated herein by reference. Another feature not here illustrated is that the zero crossing, the corona electrical signal, the segment of the corona signal gated by the analog switch and level-detected, and the signal averager timing reference trigger pulse can all be viewed on the oscilloscope 26. By being able to see what he is doing and its results, the operator can select any corona pulse for triggering thereby optimizing timing reference selection.

In operation, referring to FIGS. 1, 3, and 4, the operator adjusts variable resistor 33 (FIG. 4) to select the time delay of the preselected gating interval relative to the zero crossing of excitation frequency signal 18. The length of the gating interval can also be selected by adjusting variable resistor 34. Potentiometer 37 sets the negative voltage level corresponding to the adjustable corona signal amplitude at which the signal averager timing reference trigger pulse is generated. For each electrical corona pulse selection (see FIGS. 3c–3e), the gated corona signal is level-detected and a trigger pulse generated - initiate acoustic signal-averaging. After averaging, the averaged acoustic signal 25 (FIG. 1) is displayed to the operator. In this way, the operator can search for and find the corona pulse that results in the optimum signal-to-noise ratio of the acoustic signal prior to time-averaging. Of course, the objective is to locate the corona source and the search ends whenever the available signal-to-noise ratio is acceptable and produces an averaged acoustic signal from which the distance to the corona sources from the known acoustic transducer position can be ascertained. In the event there are multiple corona sources, the time difference $t_1$-$t_0$ representing the acoustic delay time between source and sensor is observed to be different for several averaged acoustic signals with acceptable signal-to-noise ratios. Since the time delay is proportional to distance between source and sensor, the multiple corona sources can be identified and individually located.

The corona fault location system and method have general application to the location of one or more corona sources in encased electrical apparatus having a high potential conductor, and is not restricted to the testing of large transformers for corona faults. Additionally, the fluid within the encased equipment can be a gas or a liquid. The system provides substantial savings through reduced test time and more efficient repair of faulty equipment.

While the invention has been particularly shown and described with reference to a preferred embodiment thereof, it will be understood by those skilled in the art that various changes in form and details may be made therein without departing from the spirit and scope of the invention.

The invention claimed is:

1. The method of locating a corona source within the housing of encased electrical apparatus having a high potential conductor comprising the steps of sensing at a known acoustic transducer position the acoustic vibrations within the housing including those produced by a corona discharge at the corona source, and generating an acoustic electrical signal representative of said acoustic vibrations, effecting filtering the voltage at said high potential conductor to derive an excitation frequency component signal and a radio frequency component corona signal caused by electrical disturbances accompanying corona discharge, cyclically gating said corona signal during a preselected gating interval which has an adjustable delay with respect to a reference on said excitation frequency signal to thereby find a corona pulse that results in an acceptable signal-to-noise ratio in the acoustic signal being averaged, level-detecting the gated corona signal and generating a timing reference to initiate acoustic signal averaging upon detecting a predetermined corona signal amplitude, repeatedly averaging said acoustic signal over a preset period and generating an averaged acoustic signal, and displaying said averaged acoustic signal to provide an indication of the distance from the known acoustic transducer position to the corona source.

2. The method according to claim 1 wherein the step of cyclically gating said corona signal comprises adjusting the delay of said gating interval with respect to the excitation frequency signal reference.

3. The method according to claim 2 wherein the step of cyclically gating said corona signal further comprises adjusting the length of said gating interval.

4. The method according to claim 2 wherein the step of level-detecting the gated corona signal comprises adjusting the predetermined corona signal amplitude at which said signal averaging timing reference is generated.

5. The method according to claim 1 wherein the step of cyclically gating said corona signal comprises adjusting the delay of said gating interval with respect to the zero crossing point of said excitation frequency signal used as the reference, and further adjusting the length of said gating interval, to thereby select an acoustic signal for averaging having an acceptable signal-to-noise ratio.

6. The method according to claim 5 wherein the step of level-detecting the gated corona signal comprises adjusting the predetermined corona signal amplitude at which said signal averaging timing reference is generated.

7. A corona fault locating system for determining the location of one or more corona sources within the housing of encased electrical apparatus having a high potential conductor, said system comprising an acoustic transducer mounted at a known position for sensing the acoustic vibrations within the housing including those produced by a corona discharge at the corona source and for generating an acoustic electrical signal representative of said acoustic vibrations, filter means for filtering a voltage proportional to the voltage at said high potential conductor to derive an excitation frequency component signal and a radio frequency component corona signal caused by electrical disturbances accompanying corona discharge, adjustable corona signal gating means for cyclically gating said corona signal to a level detector only during a preselected gating interval which has an adjustable delay with respect to a reference derived from said excitation frequency signal whereby various corona pulses can be selected for level detecting, said level detector being operative to generate an output timing reference pulse upon detecting a predetermined corona signal amplitude occurring during the gating interval, a signal averager to which said acoustic signal is fed continuously, said signal averager being repeatedly triggered by said timing reference pulse to repeatedly average said acoustic signal over a preset period and generate an averaged acoustic signal, and means for displaying said averaged acoustic signal to provide an indication of the distance from the known acoustic transducer position to the corona source.

8. The system according to claim 7 wherein said adjustable corona signal gating means comprises means for independently adjusting both the length of said gating interval and the delay of initiation of said gating interval with respect to the excitation frequency signal reference, to thereby select an acoustic signal for averaging having an acceptable signal-to-noise ratio.

9. The system according to claim 7 wherein said adjustable corona signal gating means comprises operator controlled means for independently adjusting both the length of said gating interval and the delay of initiation of said gating interval with respect to the zero crossing of said excitation frequency signal used as the reference, to thereby select an acoustic signal for averaging having an acceptable signal-to-noise ratio.

10. The system according to claim 9 wherein said level detector comprises operator controlled means for adjusting the corona signal amplitude at which said timing reference pulse is generated.

11. The system according to claim 7 wherein said adjustable corona signal gating means is comprised by a zero crossing detector circuit for detecting the zero crossing points of said excitation frequency signal, a timing pulse generator connected to generate a timing pulse at a variable delay after said zero crossing point used as the reference and including means for independently adjusting both the delay and width of said timing pulse, and an analog switch actuated by said timing pulse to be operative to gate said corona signal to said level detector.

12. The system according to claim 11 wherein said zero crossing detector and level detector are comparator circuits, said timing pulse generator is a monostable multivibrator, and said level detector includes means for adjusting the corona signal amplitude at which said timing reference pulse is generated.

* * * * *